BILATERAL ELECTRONIC GATE

Filed Sept. 3, 1964

INVENTOR.
EUGENE A. JANNING JR.
BY Alden D. Redfield
Irwin P. Garfinkle
ATTORNEYS.

United States Patent Office 3,239,693
Patented Mar. 8, 1966

3,239,693
BILATERAL ELECTRONIC GATE

Eugene A. Janning, Jr., West Chester, Ohio, assignor to Avco Corporation, Cincinnati, Ohio, a corporation of Delaware Filed Sept. 3, 1964, Ser. No. 394,191
8 Claims. (Cl. 307—88.5)

This invention relates to a semiconductor switch and more particularly to an electronic switch using semiconductor diodes, providing bilateral alternating current signal paths which are gated on or off by small polarized currents addressed to the diodes.

The invention provides on-off switching of signals at megacycle rates and functions as a gate to permit or prevent signal flow in either direction as commanded; however, the circuitry, because of its fast switching action, also has practical utility as a pulse code modulator which may be operated directly in a power amplifier link or be used for automatic signal transfer and automatic overload protection. In any application the invention will require very low power to change the switch from an "off" state to an "on" state and vice versa, since it uses the stored power, normally dissipated in arcing, to aid in throwing the switch.

The primary object of the invention is to provide an electronic switch in which semiconductor diodes are rapidly changed from a conducting to a non-conducting state by changing the voltage bias or polarity applied to the diodes.

Another object of this invention is the provision of an "on-off" gate capable of handling relatively high power signals and demanding very low ancillary control or command power.

Still another object of this invention is the provision of an electronic switch which introduces little or no distortion of the signal passing through the switch.

Another object of this invention is a bilateral signal transfer switch which may be gated with very low control power and which introduces a minimum of distortion.

A better understanding of the invention will be derived from the following detailed specification and from the accompanying drawings in which.

Figure 1:
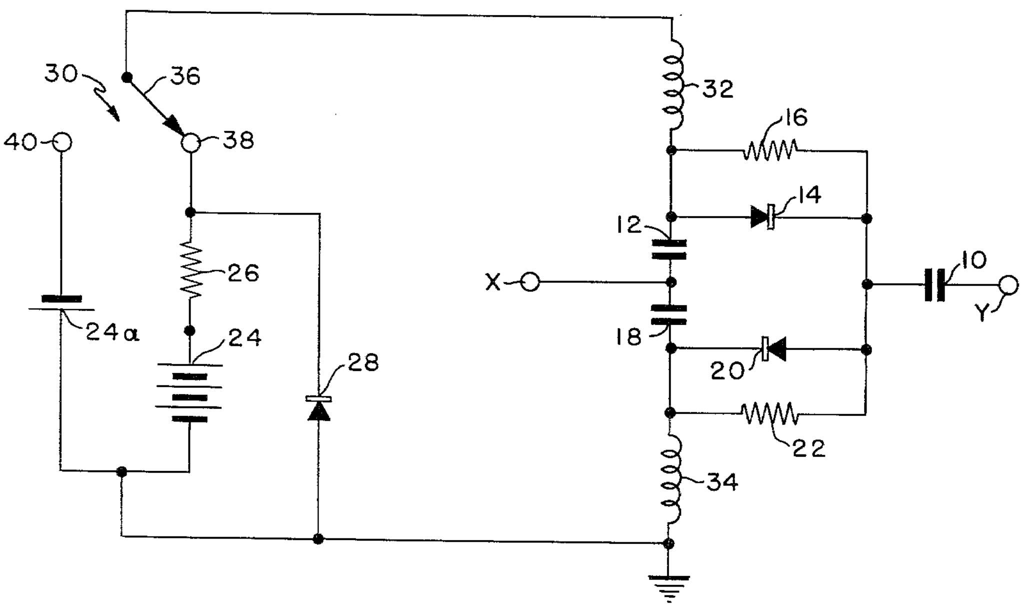
FIGURE 1 is a schematic diagram of an electronic switch made in accordance with this invention.

The illustrated electronic switch comprises terminals X and Y between which alternating current signals may be passed in either direction; that is, input signals may be applied either between terminal X and ground or between terminal Y and ground, and output signals may be derived from the other terminal in each case. The alternating current path in either direction includes a D.-C. blocking capacitor 10 in series with two composite parallel branches. One branch includes a capacitor 12 in series with a semiconductor diode 14 across which a resistor 16 is connected. The other branch in similar configuration includes a capacitor 18 in series with a semiconductor diode 20 across which a resistor 22 is connected. The resistors 16 and 22 serve to govern the D.-C. voltage on diodes 14 and 20, and are required more especially when the diodes 14 and 20 are not fairly well matched and they are essential to fast effective switching. The resistors 16 and 22 are non-critical and may be in the order of one-half megohm. They divide the D.-C. voltage on diodes 14 and 20 and render the match of these diodes fairly non-critical. Alternating current signals, both positive and negative portions, pass through the diodes 14 and 20 when the diodes are forward biased in the correct polarity; that is, when forward biased, the diodes 14 and 20 offer a very low resistive impedance to the alternating current signals applied either at terminals X or Y. On the other hand, back biasing of the diodes 14 and 20 renders them non-conductive to the alternating current signals.

Bias for the diodes 14 and 20 is obtained from an appropriate direct voltage source such as batteries 24 and 24*a*, a relatively high value resistor 26 being connected in series with battery 24. The value of the resistor 26 was approximately one kilohm to establish a forward drive on the diodes at 2 to 2½ milliamperes in an exemplar case. Preferably the voltage source should provide a relatively constant current bias source. A semiconductor diode 28 is connected across the battery 24 and the resistor 26 for a purpose which will hereinafter be explained.

A switch 30 is used to connect either the battery 24 or 24*a* to the diodes through radio frequency chokes 32 and 34. The switch 30 is provided with an armature 36 and two contacts 38 and 40. When the armature 36 is is the contact 38 position, the diode switch is in the "on" state, and when in the contact 40 position, the diode switch is in the "off" state.

Figure 2:
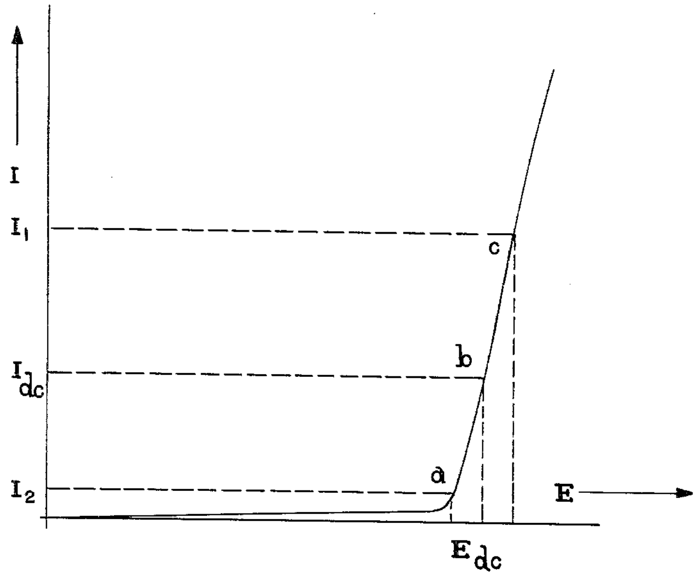
FIGURE 2 is a typical graphic presentation of the semiconductor diode voltage-current characteristics indicating the area of an "on" operation.

The connection of the diode 28 across the battery 24 and the resistor 26 serves to back-bias the diode 28. However, since the resistor 26 is relatively large, the back-biasing voltage developed across the diode 28 is very small. The forward bias on the diodes 14 and 20 is equal to approximately one-half the back-bias voltage on diode 28, assuming that the voltage is equally divided between the two diodes. In this state a positive going bias is established on diodes 14 and 20, driving the diodes 14 and 20 into a state of conduction as indicated at point *b* of FIGURE 2. With an alternating current or pulsating signal applied at either terminal X or Y, these signals will affect the running or dynamic bias on the diodes 14 and 20, swinging the conduction of the diodes between points *a* and *c* (FIGURE 2) for an instantaneous condition. The swing to *c* from *b* represents the instantaneous increase of currents through diode 14 in the forward direction. The other diode 20 also is in conduction, but the half signal wave is bucking the forward bias to a degree, with its net current flow corresponding to the point *c* being at *a*. It is noted that the generated bias current, with the signal dominant in either polar phase, remains positive. Bias on the diodes is signal governed beyond the quiescent bias point. The derived signals are essentially undistorted except for a negligible discontinuity resulting from the back-bias voltage on the diode 28. The reason for this slight discontinuity is that, in addition to the alternating current output signal, the applied signal also develops rectified pulsating direct currents through a series loop, including the diodes 14 and 20, the choke 34, the diode 28, and the choke 32. It will be noted that for the rectified pulsating signal in this loop the diodes 14, 20, and 28 are poled for unidirectional current flow.

Without the diode 28 in the circuit the rectified signal would pass through battery 24 and resistor 26, and this current would serve to establish a very large running back-bias on the diodes 14 and 20. This bias would have to be overcome by the signal prior to the passage of the alternating current signal between the terminals X and Y, and hence there would be substantial discontinuity in the output signal. That is, the alternating current output signal would have a relatively small duty cycle and would be distorted with respect to the input signal. On the other hand, with the diode 28 across the battery 24 and the resistor 26, the rectified signal is not passed through the large impedance of resistor 26, but through the low impedance of diode 28 when the small back-bias on that diode is exceeded by the signal. Hence, conduction of diode 28 serves to shunt the resistor 26 to avoid the establishment of a large running back-bias on the diodes 14 and 20. This results in essentially no distortion to the signal in passing between the terminals X and Y.

Moreover, if the applied signal is large, there is a tendency for the rectified currents to arc between the contact 38 and the armature 36 when the armature is moved from the contact 38 position to the contact 40 position. However, at the instant the armature 36 is moved from the contact 38, the entire voltage of the battery 24 is applied across the diode 28, back-biasing it far beyond conduction. Thus, the rectified signal which had been flowing through the diode 28 may now pass only through the resistor 26, which is large enough to absorb the currents and prevent arcing.

In addition, the rectified currents flowing through the chokes 32 and 34 tend to charge the chokes, which at the moment the armature 36 is in the contact 40 position are free to discharge through the battery 24*a*. The currents discharged from the chokes through the battery 24*a* are in the same polarity as the battery 24*a* and therefore augment the battery voltage to instantly back-bias the diodes 14 and 20 by amounts which are a function of the signal voltage. The back-biasing of the diode 28 prevents arcing and thus prevents the dissipation of this stored signal energy except through the diodes 14 and 20 in a direction to cut them off quickly. The thus developed back-bias on the diodes 14 and 20 will reduce at an exponential rate depending on the time constants of the circuit to the voltage of battery 24*a*.

It will be recognized that the switch 30 may be electronic, electromechanical, or manual as illustrated. It may be remotely located or it may be combined with other command functions in an electronic system.

The invention offers numerous advantages over the conventional diode switch circuitry. The admittance of alternating current signals influences the dynamic impedances of the diodes 14 and 20 approximately inversely proportional to signal magnitude. This reduces the insertion losses with increased input and enables the system to adapt to greatly increased power transfer automatically. The diodes 14 and 20 work under conditions providing good linearity in signal transfer and correspondingly low signal distortion. In addition, control for the electronic switch is accomplished by means of a small bias change almost independent of the applied signal strength. In fact, high power signal transfer aids switching, once initiated, because of the sudden build-up of rectified bias voltage emanating from the discharge of the radio frequency chokes 32 and 34 when the switch 30 is opened.

Various modifications and adaptations will at once become apparent to persons skilled in the art. It is intended, therefore, that the scope of the invention be limited only by the appended claims as interpreted in the light of the prior art.

What is claimed is:

1. An alternating current signal path having an input and an output, said path including a diode, and means for opening or closing said path to permit or prevent alternating current signals from passing from said input to said output, said means comprising:

a first direct current biasing source;

a second direct current biasing source;

an alternating current signal choke;

means selectively connecting said first direct current biasing source in a series direct current loop with said choke and said diode for initially forward-biasing said diode, thereby opening said path and permitting said alternating current signal to pass through said path, or, alternatively, connecting said second direct current biasing source in a series loop with said diode and said choke to back-bias said diode, thereby preventing alternating current signal transmission through said path, said choke discharging through said second source and said diode to initially augment said second source; and a second diode connected across said first source, said second diode being slightly back-biased by said first source.

2. The invention as defined in claim 1 wherein said diodes are semiconductors.

3. The invention as defined in claim 2 wherein said alternating current signal path includes means for preventing the flow of direct currents from said input to said output.

4. An electronic switch for alternating current signals comprising:

an alternating current signal input terminal;

an alternating current signal output terminal;

first and second parallel alternating current signal conductor paths connected between said terminals, said first signal path including a first semiconductor diode, said second signal path including a second semiconductor diode;

first and second two terminal sources of direct current biasing voltage for said diodes;

a signal choke;

a resistive impedance;

means selectively connecting said first source in a first series direct current loop with said first and second semiconductor diodes, said choke, and said resistive impedance, said diodes being poled for unidirectional direct current flow in said loop, said first source being poled for forward biasing both of said diodes or, alternatively, connecting said second source in a second series direct current loop with said first and second semiconductor diodes and said choke, said second source being poled for back-biasing both of said diodes, said choke discharging through said second source to augment said second source.

5. The invention as defined in claim 4, and a third semiconductor diode connected across said first source and said resistive impedance, said third diode being slightly back-biased by said first source.

6. The invention as defined in claim 5 and a resistor connected across each of said first and second diodes.

7. The invention as defined in claim 5, and means for preventing the flow of direct current in said signal paths.

8. The invention as defined in claim 7 wherein said last-named means comprises at least one capacitor in each path.

References Cited by the Examiner

UNITED STATES PATENTS

| | | | |
|---|---|---|---|
| 2,994,789 | 8/1961 | Gottfried | 307—88.5 |

ARTHUR GAUSS, *Primary Examiner.*

J. ZAZWORSKY, *Assistant Examiner.*